United States Patent
Shin et al.

(10) Patent No.: US 7,361,565 B2
(45) Date of Patent: Apr. 22, 2008

(54) METHOD OF FORMING A METAL GATE IN A SEMICONDUCTOR DEVICE

(75) Inventors: Jeong-Ho Shin, Euiwang-si (KR); Jong-Hyon Ahn, Suwon-si (KR); Kong-Soo Cheong, Seoul (KR); Jin-Won Jun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 388 days.

(21) Appl. No.: 11/037,506

(22) Filed: Jan. 18, 2005

(65) Prior Publication Data

US 2005/0158935 A1 Jul. 21, 2005

(30) Foreign Application Priority Data

Jan. 19, 2004 (KR) ................ 10-2004-0003901

(51) Int. Cl.
*H01L 21/336* (2006.01)
(52) U.S. Cl. ............ 438/303; 438/305; 438/595; 257/E21.621
(58) Field of Classification Search ......... 257/E21.621
See application file for complete search history.

(56) References Cited

U.S. PATENT DOCUMENTS

| | | | |
|---|---|---|---|
| 6,033,963 A | 3/2000 | Huang et al. ............ 438/303 |
| 6,100,558 A * | 8/2000 | Krivokapic et al. ........ 257/310 |
| 6,236,094 B1 * | 5/2001 | Wright ........................ 257/413 |
| 6,251,763 B1 * | 6/2001 | Inumiya et al. ............. 438/595 |
| 6,303,418 B1 * | 10/2001 | Cha et al. .................... 438/199 |
| 6,348,385 B1 * | 2/2002 | Cha et al. .................... 438/287 |
| 6,864,163 B1 * | 3/2005 | Yu et al. ...................... 438/585 |
| 2004/0137688 A1 * | 7/2004 | Chang et al. ............... 438/303 |
| 2005/0090066 A1 * | 4/2005 | Zhu et al. .................... 438/300 |
| 2006/0046399 A1 * | 3/2006 | Lindert et al. .............. 438/282 |

FOREIGN PATENT DOCUMENTS

KR 10-313546 10/2001

* cited by examiner

*Primary Examiner*—Stephen W. Smoot
(74) *Attorney, Agent, or Firm*—Mills & Onello LLP

(57) ABSTRACT

In a method of forming a metal gate in a semiconductor device, a gate insulation pattern and a dummy gate pattern are formed on a substrate. An insulation interlayer is formed on the dummy gate pattern to cover the dummy gate pattern. The insulation interlayer is polished such that a top surface of the dummy gate pattern is exposed, and the dummy gate pattern is selectively removed to form a trench on the substrate. A gate spacer is formed on an inner sidewall of the trench for determining a gate length of the metal gate. A metal is deposited to a sufficient thickness to fill the trench to form a metal layer. The metal layer is polished to remain in the trench. Accordingly, the gate length of the metal gate may be reduced no more than the resolution limit of the photolithography exposing system.

25 Claims, 9 Drawing Sheets

METHOD OF FORMING A METAL GATE IN A SEMICONDUCTOR DEVICE

CROSS-REFERENCE OF RELATED APPLICATIONS

This application relies for priority upon Korean Patent Application No. 2004-3901 filed on Jan. 19, 2004, the contents of which are herein incorporated by reference in its entirety.

BACKGROUND OF THE INVENTION

1. Field of the Invention

The present invention relates to a method of forming a metal gate in a semiconductor device. More particularly, the present invention relates to a method of forming a metal gate having a line width that is less than a resolution limit of a conventional photolithography system.

2. Description of the Related Art

As semiconductor devices continue to become more highly integrated, the pattern size, that is the minimum line width of line patterns that can be formed on the substrate, continues to become more reduced. At the same time, semiconductor devices such as memory devices, non-memory devices, or logic devices, all require a high-performance transistor that is capable of operating with high speed at a relatively low voltage, which further requires the line width of the pattern to be reduced.

In general, a gate electrode of a transistor comprises a polysilicon material. However, use of polysilicon is limited in that the line width of the gate electrode cannot be reduced beyond the resolution limit in a conventional photolithography system. For this reason, a slant etching process or a sidewall recessing process is performed for forming a transistor having a line width that is less than the resolution limit of the photolithography process. However, the slant etching process or the sidewall recessing process is disadvantageous in that the line width of a pattern to be formed is not controlled with sufficient precision, and the pattern profile formed by the slant etching process or the sidewall recessing process is rarely satisfactory.

In addition, when polysilicon material is used for forming an MOS transistor irrespective of whether the transistor is a PMOS or an NMOS-type transistor, hole or electron mobility is changed due to stress induced by the polysilicon layer, thus electrical characteristics of the semiconductor device are altered in accordance with the mobility change. Further, there is also a problem in that operation speed of the transistor is reduced since the electrical resistance of the polysilicon is relatively high.

Accordingly, metal materials have been widely utilized in place of the polysilicon material for forming a gate electrode of a semiconductor device. For example, U.S. Pat. No. 6,236,094 discloses that the metal is stacked on the gate electrode comprising polysilicon for reducing the electrical resistance thereof, and U.S. Pat. No. 6,033,963 discloses that a gate oxide layer and a metal gate are formed after a trench is formed adjacent to a portion of the substrate at which a gate electrode is to be formed. The approaches discussed in the above U.S. patents are advantageous in that the electrical resistance of the transistor can be reduced, however, they are still limited in that the gate electrode has a minimum line width that is less than the resolution limit of the photolithography process.

SUMMARY OF THE INVENTION

Accordingly, the present invention provides a method of forming a metal gate having a line width that is no more than the corresponding resolution limit of the photolithography process that is capable of operation at high speed with relatively low voltage.

According to an aspect of the present invention, there is provided a method of forming a metal gate of a semiconductor device. A gate insulation pattern and a dummy gate pattern are formed on a substrate. An insulation interlayer is formed on the dummy gate pattern such that the dummy gate pattern is covered with the insulation interlayer. The insulation interlayer is polished to expose a top surface of the dummy gate pattern. The dummy gate pattern is selectively removed to form a trench on the substrate. A gate spacer is formed on an inner sidewall of the trench, and an inside of the trench is filled up with a metal to form a metal layer. The metal layer is polished such that the metal remains in the trench.

In one embodiment, the dummy gate pattern has an etching selectivity with respect to the insulation interlayer. The dummy gate pattern comprises silicon oxynitride.

In another embodiment, ions are implanted at surface portions of the substrate, thereby forming source and drain regions neighboring the dummy gate pattern after forming the dummy gate pattern.

In another embodiment, a dummy gate spacer is formed along a sidewall of the dummy gate pattern after forming the dummy gate pattern, the dummy gate spacer comprising a material having an etching selectivity with respect to the dummy gate pattern. An offset spacer is formed along a sidewall of the dummy gate pattern for controlling a length of electron diffusion during an ion implantation process before the dummy gate spacer is formed. Ions can be heavily implanted at surface portions of the substrate, thereby forming highly doped source and drain regions neighboring the dummy gate pattern after the dummy gate spacer is formed.

In another embodiment, a metal silicide layer is selectively formed on a portion of the substrate exposed about sidewalls of the dummy gate pattern after the dummy gate pattern is formed. The metal silicide layer comprises cobalt silicide, nickel silicide or tungsten silicide.

In another embodiment, an etching stop layer is formed on the dummy gate pattern and the substrate before forming the insulation interlayer.

In another embodiment, prior to polishing the insulating interlayer, a lower portion of the insulation interlayer is higher than a top surface of the dummy gate pattern.

In another embodiment, the dummy gate pattern is selectively removed by a wet etching process.

In another embodiment, a liner is formed on the inner sidewall of the trench before the gate spacer is formed, that protects the inner sidewall of the trench. The liner comprises an oxide layer or a nitride layer.

In another embodiment, the gate spacer comprises a material having an etching selectivity with respect to a gate insulation layer underlying the gate spacer, for example silicon nitride.

In another embodiment, forming the gate spacer includes: forming an insulation layer for the gate spacer in the trench and on the insulation interlayer; and anisotropically and selectively etching the insulation layer, so that portions of the insulating layer formed on the insulation interlayer and on the gate insulation layer are selectively removed.

In another embodiment, the gate spacer is selectively formed at a lower portion of the inner sidewall of the trench, so that an upper portion of the inner sidewall of the trench is exposed.

In another embodiment, the metal with which the trench is filled includes molybdenum (Mo) or tungsten (W).

In another embodiment, an upper portion of the metal layer is of a larger width than that of a lower portion of the metal layer.

In another embodiment, a width of the gate spacer controls a width of the metal gate.

According to another aspect of the present invention, there is also provided a method of forming a metal gate of a semiconductor device. A gate insulation pattern and a dummy gate pattern are formed on a substrate. An insulation interlayer is formed on the insulation interlayer such that the dummy gate pattern is covered with the insulation interlayer. The insulation interlayer is polished to expose a top surface of the dummy gate pattern. The dummy gate pattern is selectively removed to form a trench on the substrate. Then, a gate spacer is formed on an inner sidewall of the trench. The gate insulation pattern remaining on a bottom surface of the trench is selectively removed, and a gate insulation layer is formed on the bottom surface of the trench. An inside of the trench is filled up with a metal to form a metal layer, and the metal layer is polished such that the metal remains in the trench.

In one embodiment, the gate spacer is selectively formed at a lower portion of the inner sidewall of the trench, so that an upper portion of the inner sidewall of the trench is exposed.

According to the present invention, the gate spacer ensures that a gate pattern has a line width that is no more than the resolution limit of the photolithographic exposure system. Thus the channel length of a transistor may be reduced beyond the ability of the exposure system. In addition, a width of the gate electrode is greater at an upper portion thereof than at a lower portion thereof, thus the gate size increases to thereby reduce the electrical resistance of the gate electrode.

BRIEF DESCRIPTION OF THE DRAWINGS

The above and other features and advantages of the present invention will become readily apparent by reference to the following detailed description of embodiments of the invention when considered in conjunction with the accompanying drawings, in which.

DETAILED DESCRIPTION OF THE EMBODIMENTS

The present invention now will be described more fully hereinafter with reference to the accompanying drawings in which exemplary embodiments of the present invention are shown.

Embodiment 1

FIGS. 1A to 1I are cross sectional views showing processing steps of a method of forming a metal gate according to a first embodiment of the present invention.

Figure 1A:
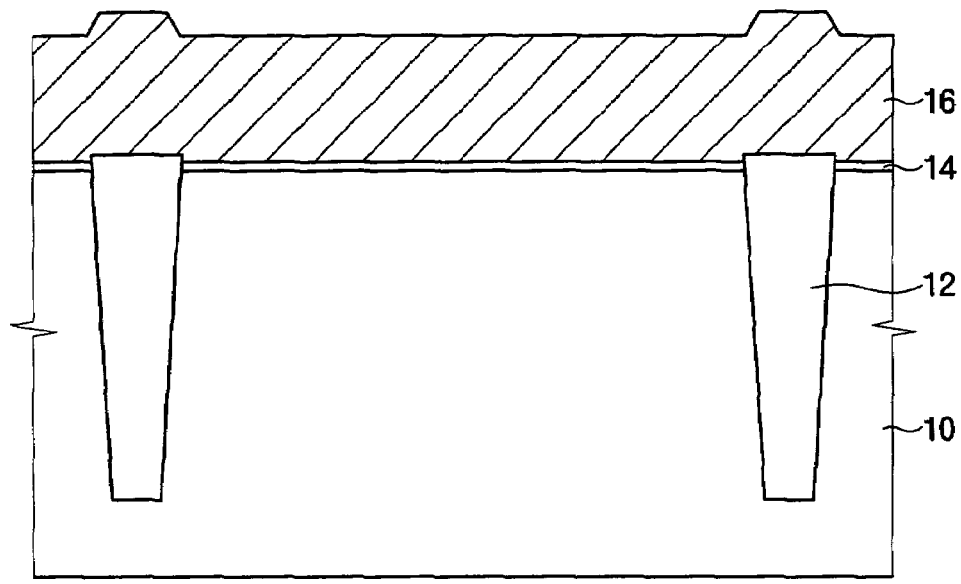
FIGS. 1A to 1I are cross sectional views showing processing steps of a method of forming a metal gate according to a first embodiment of the present invention.

Referring to FIG. 1A, a device isolation process such as a shallow trench isolation (STI) process is performed on a semiconductor substrate 10; thus an active region and a field region 12 are defined on the substrate 10. Then, an ion implantation process is performed on the substrate 10, thereby forming a well region and a channel region on the substrate 10. A gate oxide layer 14 is formed on the substrate on which the active region and field region are defined.

A dummy gate layer 16 is formed on the gate oxide layer 14 so as to form a gate pattern on the gate oxide layer 14. The dummy gate layer 16 comprises an insulation material having an etching selectivity with respect to the gate oxide layer 14. For example, the dummy gate layer 16 comprises a nitride-based material such as silicon oxynitride (SiON) or silicon nitride (SiN).

Figure 1B:
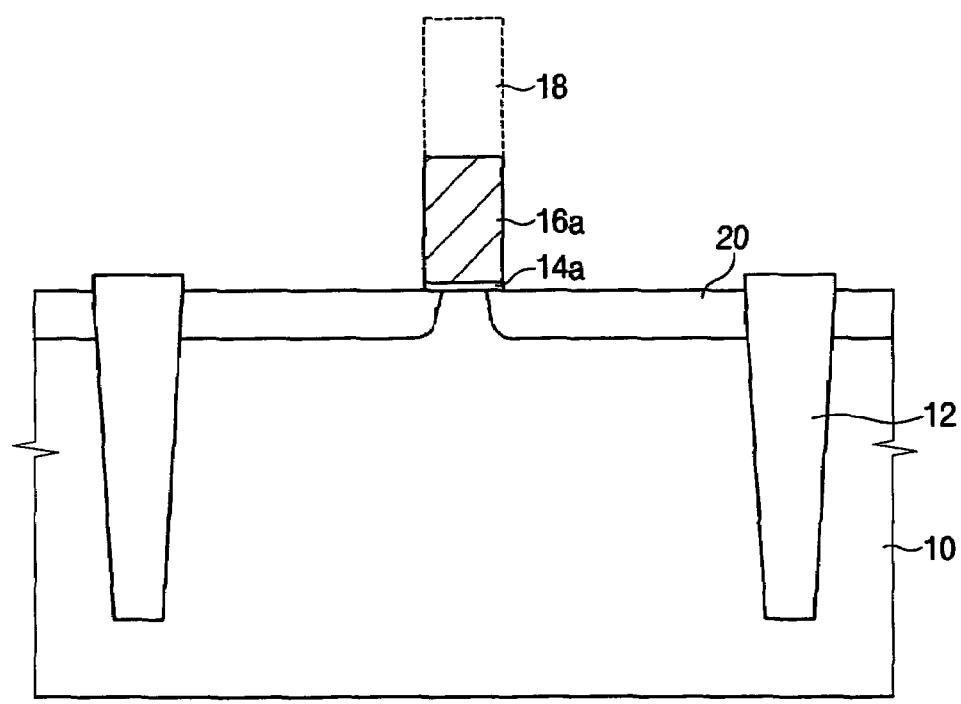

Referring to FIG. 1B, a photoresist layer is formed on the dummy gate layer 16, and a photoresist pattern 18 is formed by a conventional photolithography process. Then, the dummy gate layer 16 and the gate oxide layer 14 are sequentially etched away using the photoresist pattern 18 as an etching mask to form a gate oxide pattern 14a and a dummy gate pattern 16a.

A conventional gate pattern comprising polysilicon is formed by a dual etching process. That is, a hard mask pattern is formed on a polysilicon layer using a photoresist pattern as a first etching mask, and the polysilicon layer is etched using the hard mask pattern as a second etching mask to form the conventional gate pattern. In the present embodiment, however, a single etching process can be employed to form the dummy gate pattern 16a according to the illustrated embodiment. Accordingly, the etching process for forming the dummy gate pattern is simplified, and the line width of the dummy gate pattern can be minimized and variation of the pattern profile can be better controlled. In addition, the dummy gate pattern of the present invention is formed to be uniform throughout the entire substrate. The photoresist pattern 18 is completely removed by a conventional ashing or strip process after forming the dummy gate pattern 16a.

Returning to FIG. 1B, impurities are implanted into surface portions of the substrate 10 on which the dummy gate pattern 16a is already formed to thereby form lightly doped source/drain regions 20. In detail, the implantation process is preferably performed in such a manner that the lightly doped source/drain regions 20 are respectively positioned at surface portions of the substrate 10 in view of a gate length reduction when the gate pattern is eventually formed on the basis of the dummy gate pattern 16a. As will be described in detail below, the gate length of the eventual resulting gate pattern is reduced as compared with the original line width of the dummy gate pattern 16a, and thus, the ion implantation process is performed while taking into consideration the gate length reduction. Here, the gate length is defined as the distance of the channel region under the gate pattern between the source region and the drain region. In addition, the implantation process is also performed in view of a diffusion distance for which electrons in the source/drain regions are diffused under the dummy gate pattern 16a.

Figure 1C:
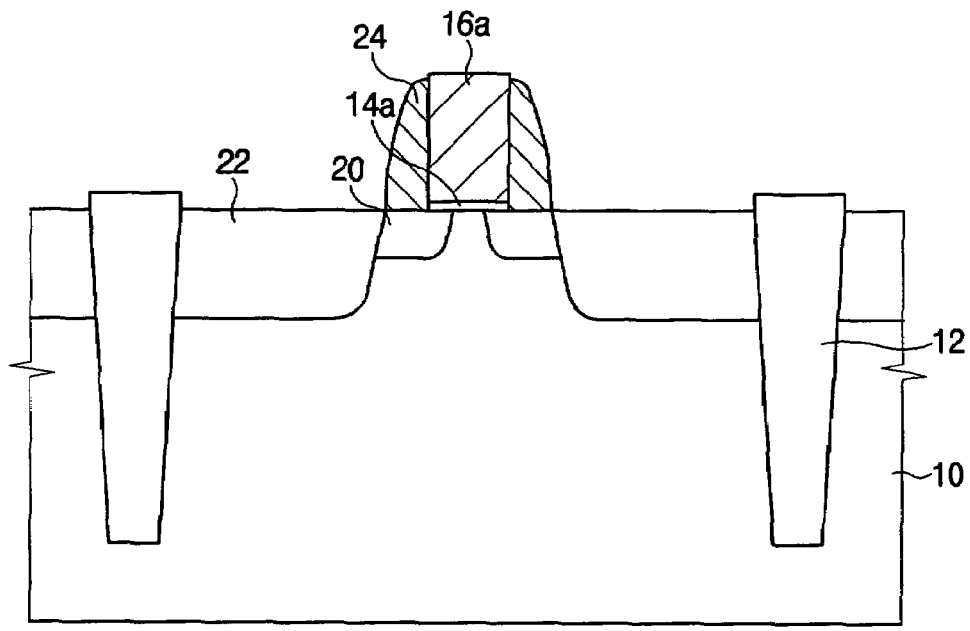

Referring to FIG. 1C, a first insulation layer is formed along a profile of the dummy gate pattern 16a, and then the first insulation layer is anisotropically etched away to form a first spacer 24 on a sidewall of the dummy gate pattern 16a. The first spacer 24 comprises a material having an etching selectivity with respect to the dummy gate pattern 16a, so that the material of the first spacer 24 is determined in accordance with the material used for the dummy gate pattern 16a. For example, when the dummy gate pattern 16a comprises silicon oxynitride, the first spacer 24 comprises silicon oxide or silicon nitride. Alternatively, when the dummy gate pattern 16a comprises silicon nitride, the first spacer 24 comprises silicon oxide.

Then, impurities are implanted at surface portions of the substrate 10 using the first spacer 24 and the dummy gate pattern 16a as a mask, thereby forming heavily doped source/drain regions 22.

Figure 1D:
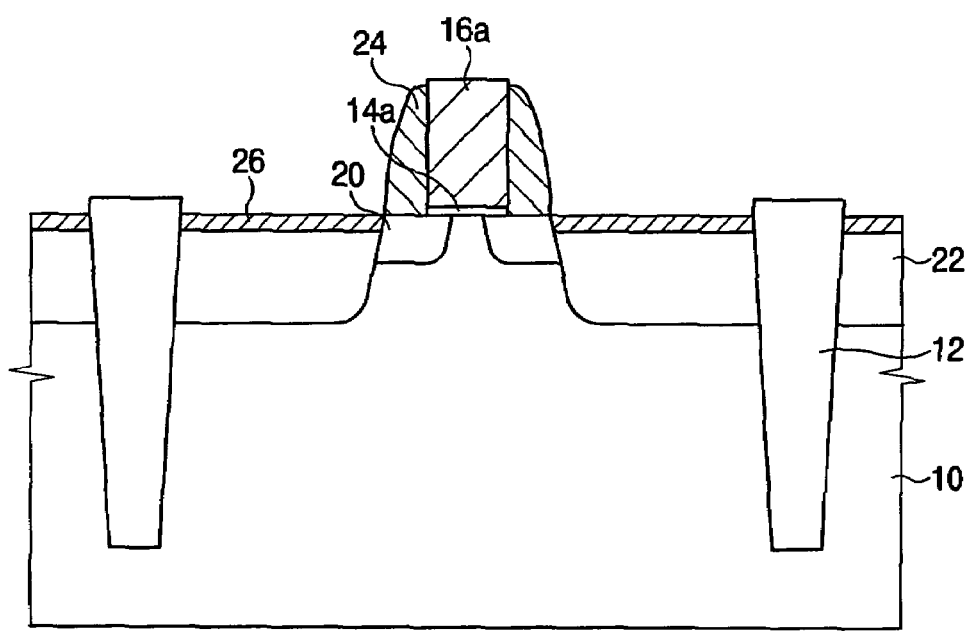

Referring to FIG. 1D, a metal layer is formed on the first spacer 24, the dummy gate pattern 16a and the silicon substrate 10, and the metal layer is transformed into a metal-silicide layer 26 by a conventional silicidation process. Non-reacted metal layer that is not transformed into the metal-silicide layer 26 during the silicidation process and the remnants of the silicidation process are completely removed from the substrate 10. Accordingly, the metal-silicide layer 26 is formed only on exposed portions of the substrate 10 corresponding to the heavily doped source/drain regions 22, and is not formed on the dummy gate pattern 16a.

Figure 1E:
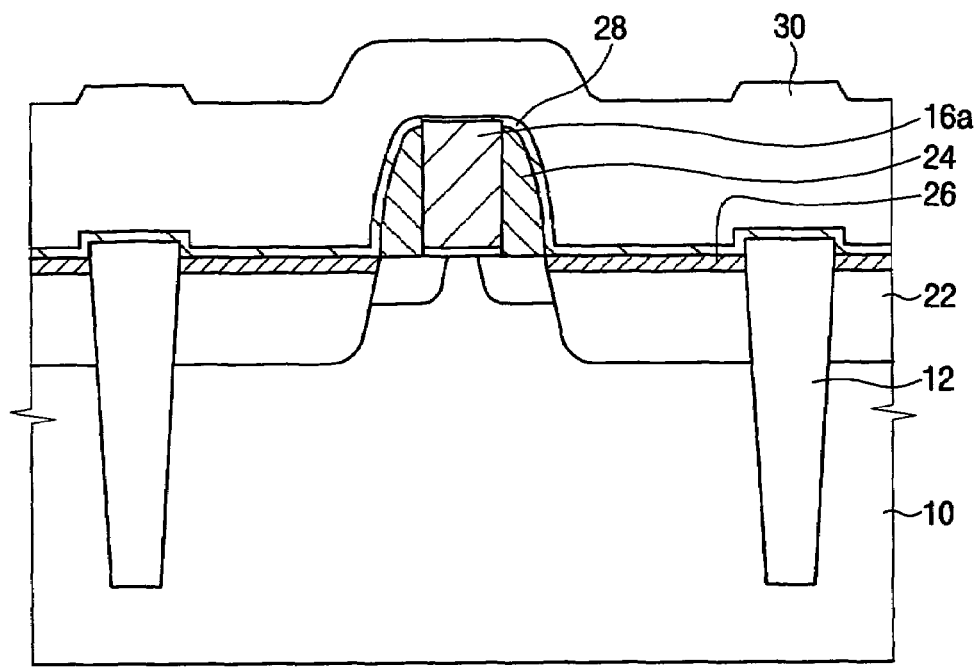

Referring to FIG. 1E, an etching stop layer 28 is formed on the first spacer 24, the dummy gate pattern 16a and the metal-silicide layer 26, and comprises a material having an etching selectivity with respect to the silicon oxide layer. In addition, the etching stop layer 28 preferably comprises a material having an etching selectivity with respect to the dummy gate pattern 16a. Examples of the etching stop layer 28 include a silicon nitride layer or a silicon oxynitride layer. In a subsequent wiring process, an etching process for forming a contact hole connecting to the heavily doped source/drain regions 22 is terminated on the etching stop layer 28, so that a recession of the substrate 10 corresponding to the heavily doped source/drain regions 22 is minimized during the etching process for forming the contact hole.

The etching stop layer 28 may be omitted for process simplification. For example, when the contact hole connected to the heavily doped source/drain regions 22 is not relatively long and a junction area of the heavily doped source/drain regions 22 is relatively large, an etching process margin may be configured in such a way that the etching process is terminated around the metal-silicide layer 26 in place of the etching stop layer 28.

A silicon oxide layer is formed on the etching stop layer 28 such that the dummy gate pattern 16a is covered with the silicon oxide layer to form an insulation interlayer 30. The insulation interlayer 30 requires no stepped portion with respect to the dummy gate pattern 16a, so that the depth of the insulation interlayer is such that a lower portion of the insulation interlayer 30 is higher in position than a top surface of the dummy gate pattern 16a.

Figure 1F:
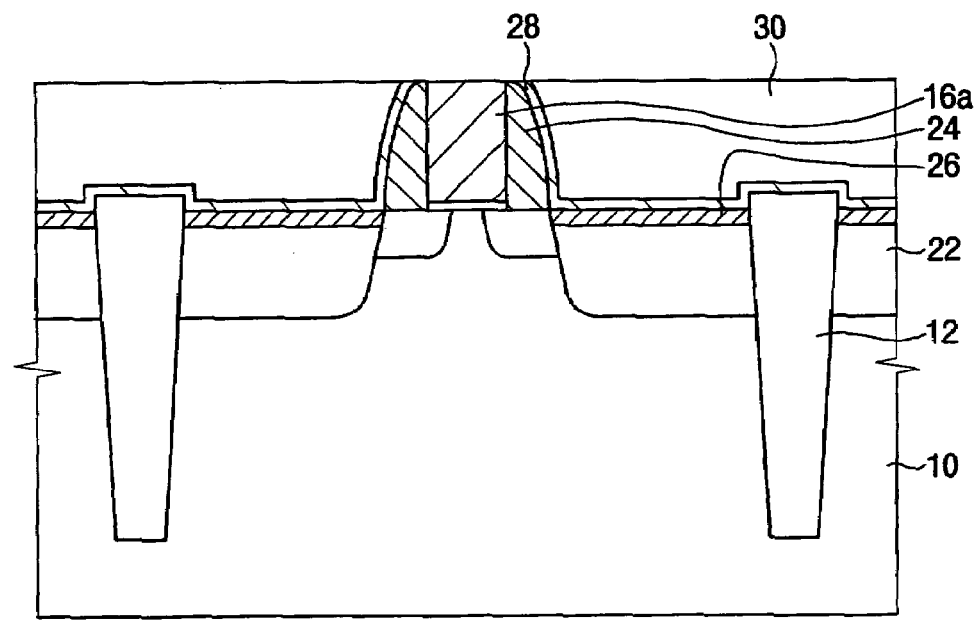

Referring to FIG. 1F, the insulation interlayer 30 is planarized by a chemical mechanical polishing (CMP) process such that a top surface of the dummy gate pattern 16a is exposed, so that the insulation interlayer 30, the dummy gate pattern 16a and the etching stop layer 28 are exposed and planarized at the same level to thereby have no stepped portion therebetween.

Figure 1G:
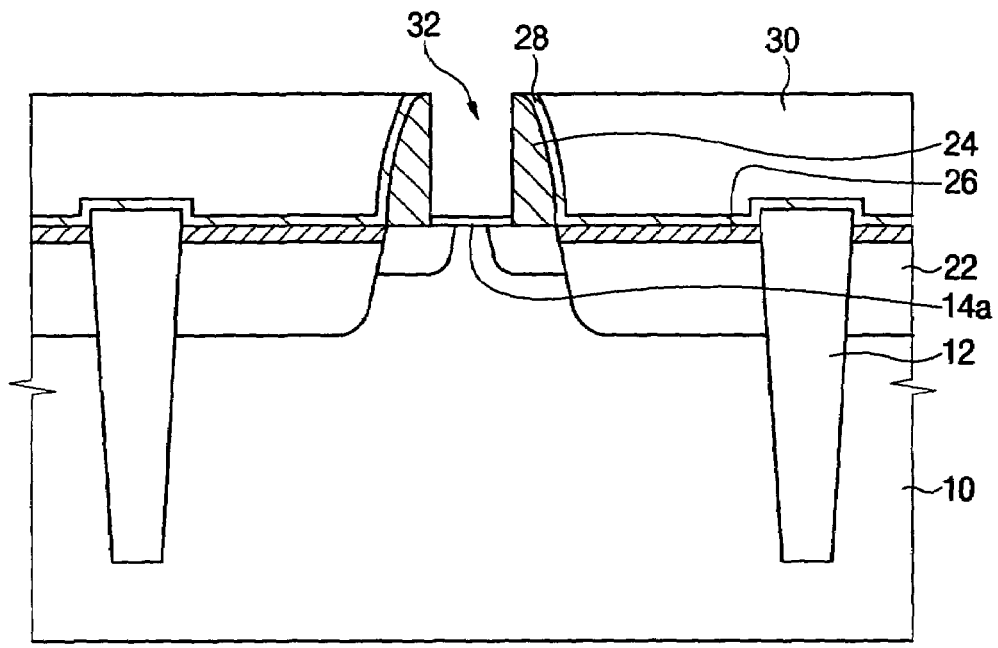

Referring to FIG. 1G, the exposed dummy gate pattern 16a is selectively removed, thereby forming a trench 32. As an exemplary embodiment, the dummy gate pattern 16a is wet-etched away using an etchant having an etch selectivity with respect to the first spacer 24 and the gate oxide layer pattern 14a, such that they are hardly, or not, etched.

When the dummy gate pattern 16a and the etching stop layer 28 are formed of the same material, the etching stop layer 28 is also partially etched and recessed during the etching process for the dummy gate pattern 16a though not shown in FIG. 1G. The recessed portion of the etching stop layer 28 is filled up with a second spacer during a subsequent process, to eliminate the possibility of device failure due to the etching process. However, the etching stop layer 28 having an etching selectivity with respect to the dummy gate pattern 16a improves the stability of the etching process, as fully described above.

A liner (not shown) is optionally formed on an inner sidewall of the trench 32 and on a surface of the insulation interlayer 30 to a thickness of about 20 Å. The liner prevents the inner sidewall of the trench 32 from being damaged during the etching process for forming the trench 32, thereby minimizing a roughness of the inner sidewall of the trench 32. For example, the liner may comprise silicon oxide or silicon nitride.

Figure 1H:
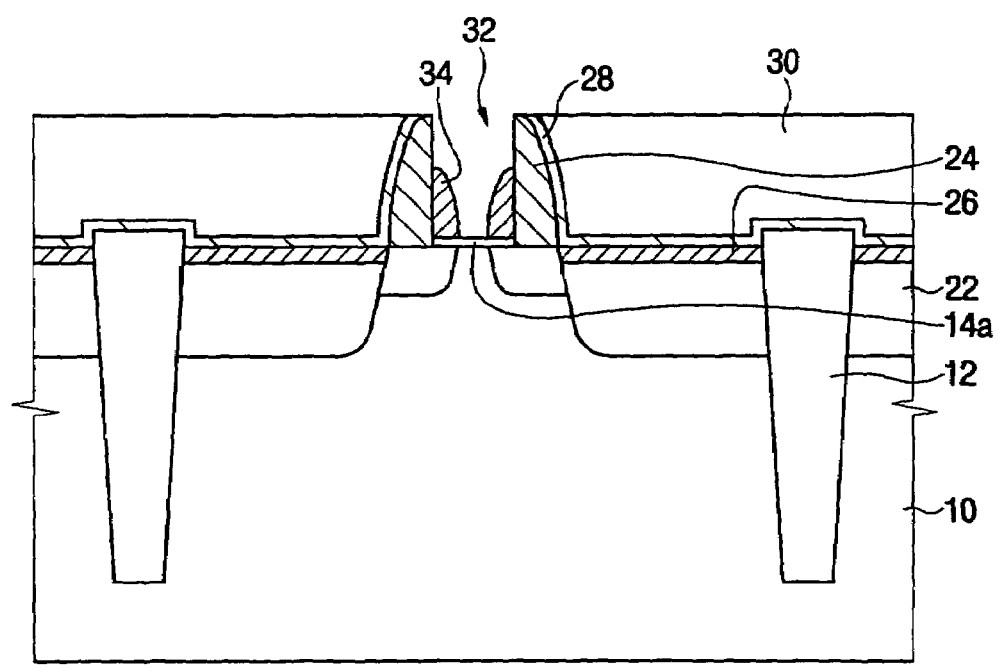

The liner is formed on a bottom surface of the trench 32, that is, on the gate oxide layer pattern 14a, as well as on the inner sidewall of the trench 32, so that the gate oxide layer pattern 14a becomes thicker by an amount that is determined according to the thickness of the liner when the liner comprises silicon oxide. Accordingly, the thickness of the liner is determined in accordance with the thickness increase of the gate oxide layer pattern 14a caused by the liner thickness and a capacitance increase due to the liner. However, when the liner comprises silicon nitride, the liner on the gate oxide layer pattern 14a may be removed while a second spacer 34, such as that shown in FIG. 1H, is formed on an inner sidewall of the trench 32 in a subsequent process, so that the thickness of the gate oxide layer pattern 14a remains unchanged. Formation of the liner is optional and can be eliminated where possible for process simplification.

Referring to FIG. 1H, a second insulation layer is formed on inner surfaces of the trench 32 and on the insulation interlayer 30. Then, the second insulation layer is anisotropically and selectively etched away, and thus portions of the second insulation layer formed on the insulation interlayer 30 and the gate oxide layer pattern 14a are selectively removed to thereby form a second spacer 34 on the inner sidewall of the trench 32 for controlling the gate length of a transistor.

The second spacer 34 comprises a material having an etching selectivity with respect to the gate oxide layer pattern 14a that is a bottom surface of the trench 32 since the gate oxide layer pattern 14a needs to remain without being etched during the etching process for forming the second spacer 34. For example, the second spacer 34 comprises silicon nitride or silicon oxynitride.

The trench 32 has a variety of optional inner shapes in accordance with the resulting height and width of the second spacer 34, and the inner shape of the trench 34 functions as a mold pattern for forming a gate pattern. Therefore, a modified inner shape of the gate pattern due to the second spacer 34 may determine the shape and property of the gate pattern.

In detail, the second spacer 34 reduces the width of the gate oxide layer pattern 14a exposed through the trench 32, and the gate pattern is formed in the trench 32 in a subsequent process. Accordingly, the reduced width of the gate oxide layer pattern 14a exposed through the trench 32 decisively determines the resulting channel length of the transistor. That is, an optimal gate length of the transistor may be determined by controlling the formation of the second spacer, which in turn, controls the resulting width of the second spacer 34. In addition, the gate pattern may also have a line width no more than the resolution limit of the exposing system since the second spacer 34 reduces a bottom size of the trench 32 on which the gate pattern is formed.

As an exemplary embodiment, the second spacer 34 may be selectively formed on a lower portion of the sidewall such that an upper portion of the sidewall is exposed in the trench 32. In this inner structure of the trench 32, the upper portion of the trench 32 remains unchanged in width, and the lower portion of the trench 32 is reduced in width by the width of the second spacer 34. Accordingly, a T-shaped gate pattern of which upper size is larger than the lower size thereof may be formed along the above-mentioned inner shape of the trench 32 in a subsequent process.

Figure 1I:
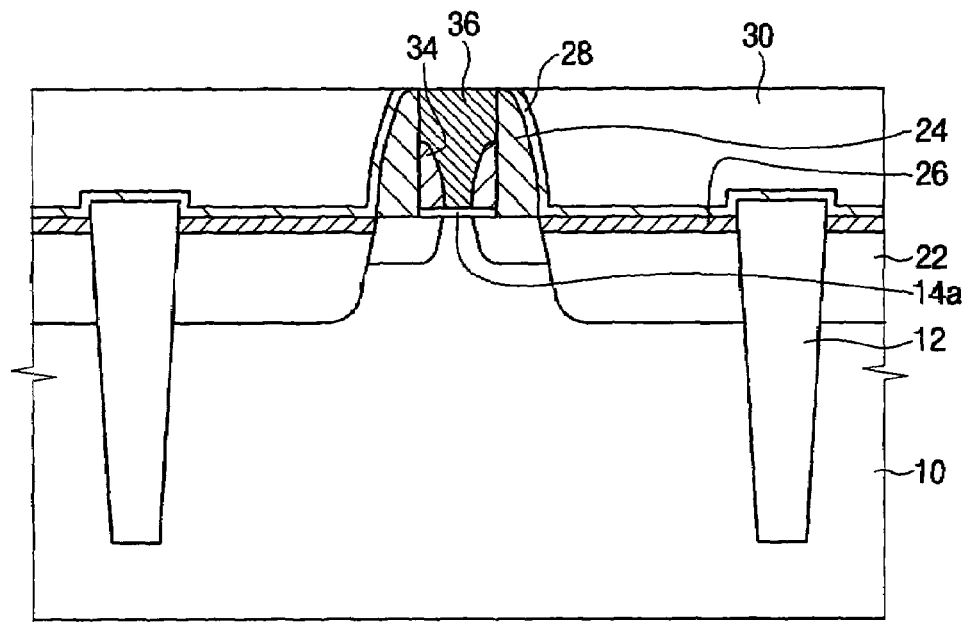

Referring to FIG. 1I, a metal layer is formed on the insulation interlayer 30 to a thickness sufficient to fill up the trench 32 with a metal having an excellent fill-up property such as tungsten (W) and molybdenum (Mo). The excellence of the fill-up property ensures that the metal fills up the trench 32 without void. For example, a physical vapor deposition (PVD) method, a sputtering method or a chemical vapor deposition (CVD) method is used for forming the metal layer.

The metal layer is planarized and removed by using a chemical mechanical polishing (CMP) method such that the metal layer on the insulation interlayer 30 is completely removed and remains only in the trench 32. Accordingly, a metal gate pattern 36 is formed in the trench 32 after the polishing process.

As described above, the metal gate pattern 36 has a T shape of which an upper width is larger than the lower width thereof, and the second spacer 34 supports a lower portion of the metal gate pattern 36 having a width that is relatively small. Therefore, the metal gate pattern 36 is formed into a stable structure, so that the transistor according to the present invention may operate with high speed at a relatively low voltage even though the gate length thereof is reduced. In addition, a size of the pattern is increased as compared with a conventional gate pattern having a vertical profile since the metal gate pattern is formed to have a T-shape, so that the electrical resistance of the gate pattern may be minimized, even though the gate length is reduced.

In an alternative embodiment, the gate oxide layer pattern 14a exposed at the bottom of the trench 32 is removed before the metal layer is formed, and a secondary gate oxide layer is again formed on the bottom portion of the trench 32 to a desired thickness by using, for example, a deposition method or a heat oxidation method. The metal layer is formed on the secondary gate oxide layer and is planarized by the same method as described above. The secondary gate oxide layer substitutes for the original gate oxide layer pattern 14a that might have been considerably damaged in previous processing steps. Accordingly, use of a damaged gate oxide layer is avoided thereby increasing the reliability of the transistor.

Embodiment 2

FIGS. 2A to 2E are cross sectional views showing processing steps of a method of forming a metal gate according to a second embodiment of the present invention. The second embodiment of the present invention as will be described hereinafter is the same as the first embodiment of the present invention except that the first spacer and the ion implantation using the first spacer as a mask are omitted. Thus, the same reference numerals in the present embodiment denote the same elements in the first embodiment of the invention, and the detailed descriptions of the same elements will be omitted to avoid a redundancy.

Figure 2A:
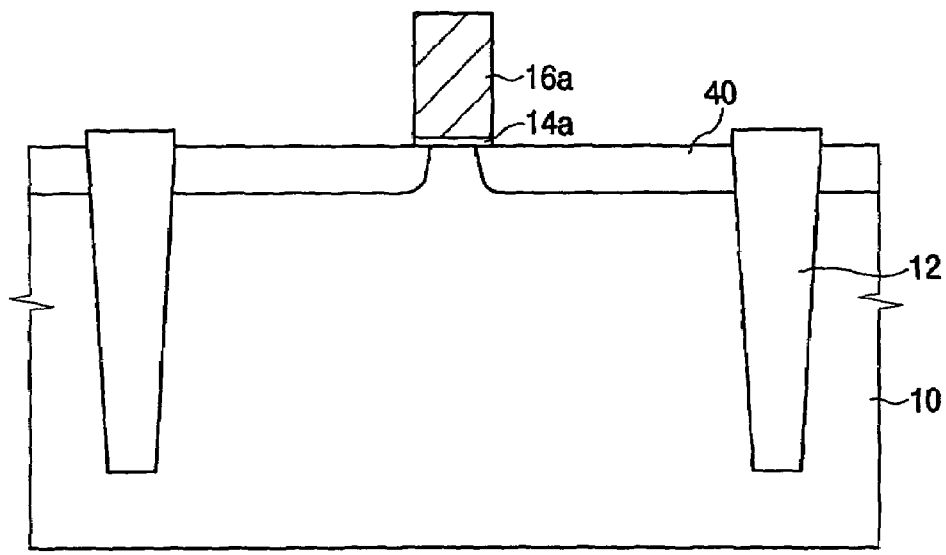
FIGS. 2A to 2E are cross sectional views showing processing steps of a method of forming a metal gate according to a second embodiment of the present invention.

Referring to FIG. 2A, a device isolation process such as a shallow trench isolation (STI) process is performed on a semiconductor substrate 10, thus an active region and a field region 12 are defined on the substrate 10. Then, an ion implantation process is performed on the substrate 10, thereby forming a well region and a channel region on the substrate 10. A gate oxide layer and a dummy gate layer are formed on the substrate on which the active region and the field region are defined, and a conventional photolithography process is carried out on the gate oxide layer and the dummy gate layer, thereby forming a gate oxide layer pattern 14a and a dummy gate pattern 16a.

Impurities are implanted into surface portions of the substrate 10 on which the dummy gate pattern 16a is already formed to thereby form source/drain regions 40. In the present embodiment, the source/drain region does not have a lightly doped source/drain (LDD) structure. That is, when a processing margin for the ion implantation process may be sufficiently obtained without utilizing the LDD structure at the source/drain regions, the spacer and the ion implantation for forming the LDD structure may be omitted.

In detail, the implantation process is preferably performed in such a way that the source/drain regions 40 are respectively positioned at surface portions of the substrate 10 in view of a gate length reduction when the gate pattern is formed on the basis of the dummy gate pattern 16a. As will be described in detail below, the gate length of the gate pattern is reduced as compared with the line width of the dummy gate pattern 16a, so that the ion implantation process is performed while considering the eventual reduction in gate length. In addition, the implantation process is also performed in consideration of the diffusion distance for which electrons in the source/drain regions are diffused under the dummy gate pattern 16a.

Figure 2B:
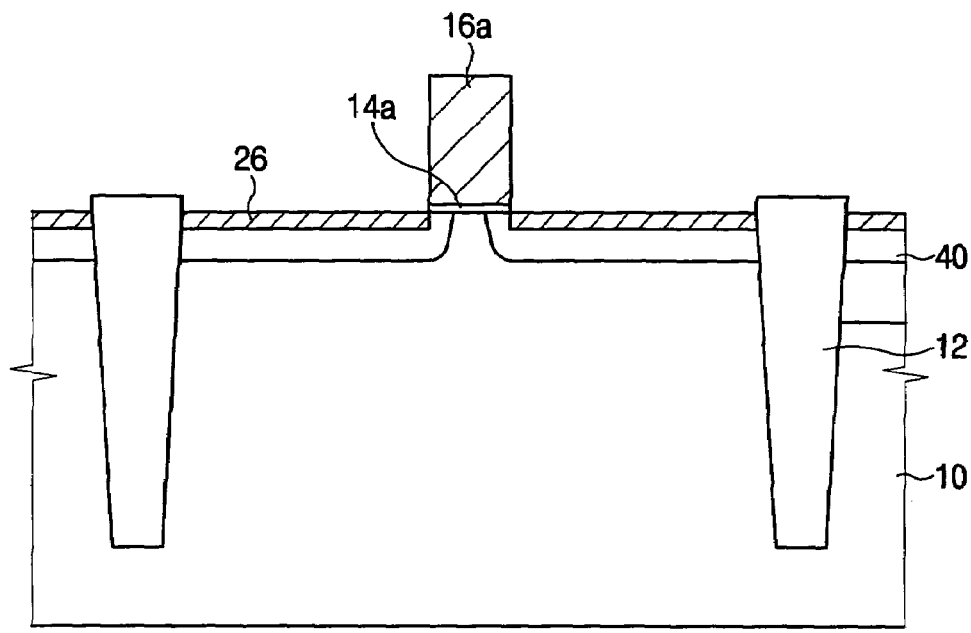

Referring to FIG. 2B, a metal layer is formed on the dummy gate pattern 16a and the silicon substrate 10, and then is transformed into a metal-silicide layer 26 by a conventional silicidation process. Non-reacted metal layer that is not transformed into the metal-silicide layer during the silicidation process and the remnants of the silicidation process are completely removed from the substrate 10. Accordingly, the metal-silicide layer 26 is formed only on exposed portions of the substrate 10 corresponding to the source/drain regions 40, and is not formed on sidewalls and a top surface of the dummy gate pattern 16a.

Following this, the same processes as described with reference to FIGS. 1E to 1I are performed hereinafter.

Figure 2C:
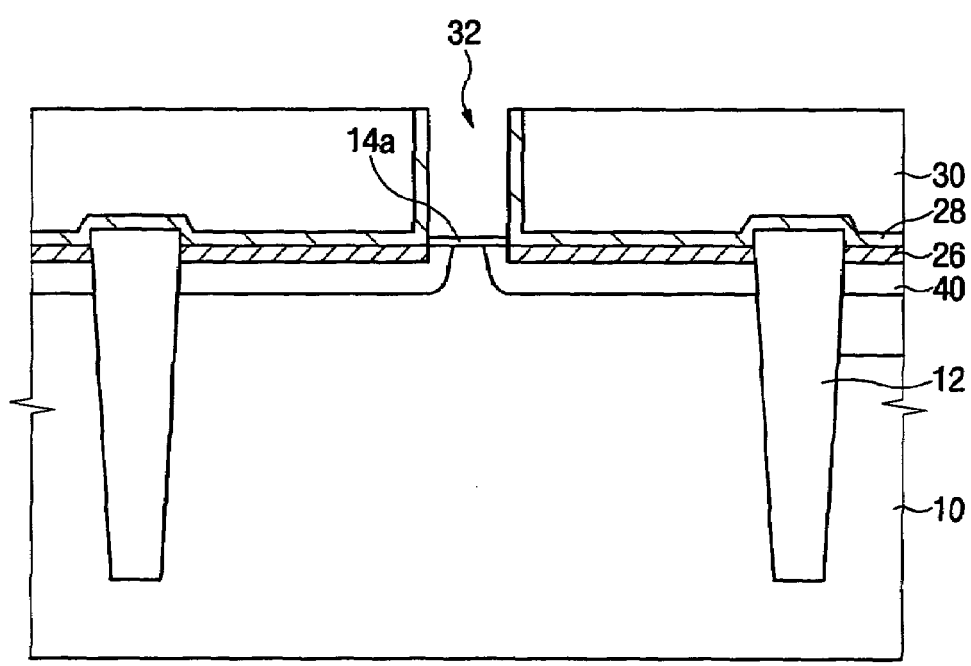

Referring to FIG. 2C, an etching stop layer 28 is formed on the dummy gate pattern 16a and the metal-silicide layer 26, and an insulation interlayer 30 is formed on the etching stop layer 28 such that the dummy gate pattern 16a is covered with the insulation interlayer 30. The insulation interlayer 30 is planarized polished by a chemical mechanical polishing (CMP) process, so that a top surface of the dummy gate pattern 16a is exposed. The etching stop layer 28 has an etching selectivity with respect to the silicon oxide layer and the dummy gate pattern 16a. The etching stop layer 28 may be omitted for process simplification.

The exposed dummy gate pattern 16a is selectively removed, thereby forming a trench 32. As an exemplary embodiment, the dummy gate pattern 16a is wet-etched away using an etchant having etch selectivity with respect to the etching stop layer 28 such that the etching stop layer 28 is hardly etched.

A liner (not shown) is formed on an inner sidewall of the trench 32 and on a surface of the insulation interlayer 30 to a thickness of about 20 Å. The liner prevents the inner sidewall of the trench 32 from being damaged during the etching process for forming the trench 32, thereby minimizing roughness of the inner sidewall of the trench 32. The liner may optionally not be formed on the inner sidewall of the trench 32 for process simplification.

Figure 2D:
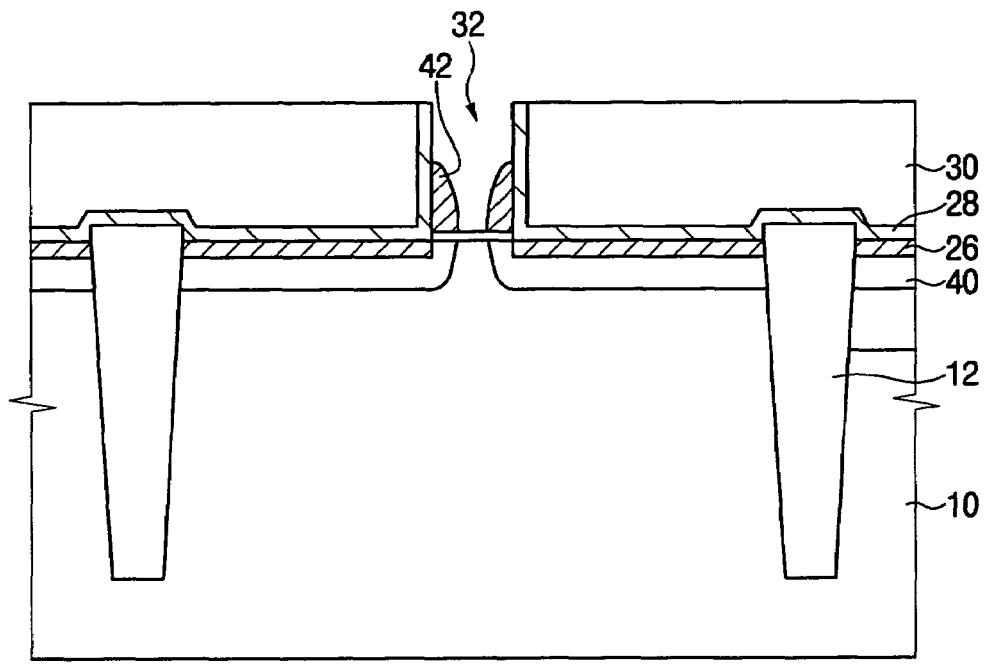

Referring to FIG. 2D, an insulation layer is formed on inner surfaces of the trench 32 and on the insulation interlayer 30. Then, the insulation layer is anisotropically and selectively etched away, and thus portions of the insulation layer formed on the insulation interlayer 30 and the gate oxide layer pattern 14a are selectively removed to thereby form a second spacer 42 on the inner sidewall of the trench 32 for controlling the gate length of a transistor. The spacer 42 prevents an electrical shorting between a gate pattern to be formed in a subsequent process and the metal-silicide layer 26 formed on the source/drain regions 40. The trench 32 has a variety of inner shapes in accordance with the height and width of the spacer 42, and the inner shape of the trench 32 functions as a mold pattern for forming a gate pattern. Therefore, a modified inner shape of the gate pattern due to the spacer 24 further determines the shape and property of the gate pattern.

Figure 2E:
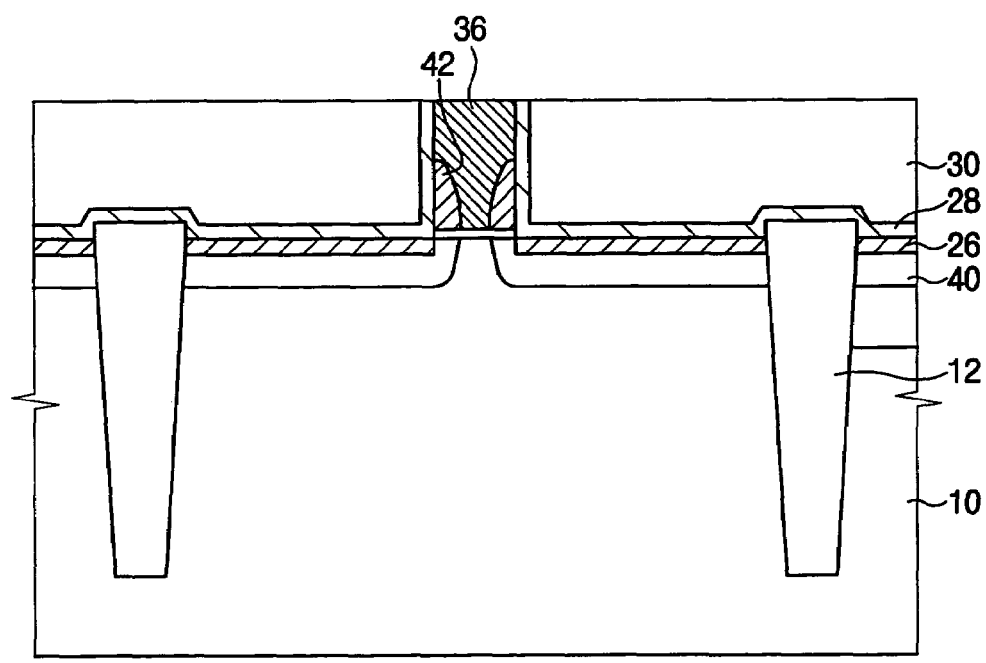

Referring to FIG. 2E, a metal layer is formed on the insulation interlayer 30 to a thickness sufficient to fill up the trench 32 with a metal having an excellent fill-up property such as tungsten (W) and molybdenum (Mo). The metal layer is planarized and removed by using a chemical mechanical polishing (CMP) method such that the metal layer on the insulation interlayer 30 is completely removed and remains only in the trench 32. Accordingly, a metal gate pattern 36 is formed in the trench 32 along the inner sidewall of which the spacer 42 is formed after the polishing process.

Though not shown in figures, a silicon oxide material may be deposited on the metal gate pattern and the insulation interlayer, thereby forming an upper insulation interlayer. A contact process may be further performed for forming a contact hole connected to the source/drain regions.

Embodiment 3

FIGS. 3A to 3D are cross sectional views showing processing steps of a method of forming a metal gate according to a third embodiment of the present invention. The third embodiment of the present invention as will be described hereinafter is the same as the first embodiment of the present invention except that an offset spacer is formed. Thus, the same reference numerals in the present embodiment denote the same elements in the first embodiment of the invention, and the detailed descriptions of formation of the same elements will be omitted to avoid redundancy.

Figure 3A:
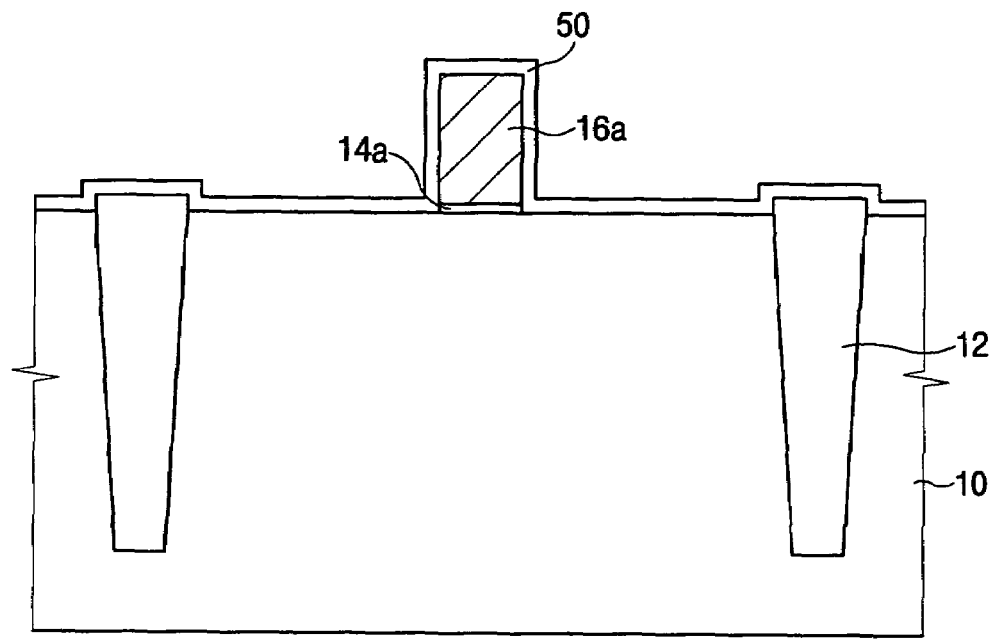
FIGS. 3A to 3D are cross sectional views showing processing steps of a method of forming a metal gate according to a third embodiment of the present invention.

Referring to FIG. 3A, a device isolation process such as a shallow trench isolation (STI) process is performed on a semiconductor substrate 10, thus an active region and a field region 12 are defined on the substrate 10. Then, an ion implantation process is performed on the substrate 10, thereby forming a well region and a channel region on the substrate 10. A gate oxide layer and a dummy gate layer are formed on the substrate on which the active region and the field region are defined, and a conventional photolithography process is carried out on the gate oxide layer and the dummy gate layer, thereby forming a gate oxide layer pattern 14a and a dummy gate pattern 16a.

An offset layer 50 is formed on the substrate 10, the gate oxide layer pattern 14a and the dummy gate pattern 16a to a thickness no more than about 30 Å. The offset layer 50 comprises a material having an etching selectivity with respect to the dummy gate pattern 16a such as silicon oxide or silicon nitride.

Figure 3B:
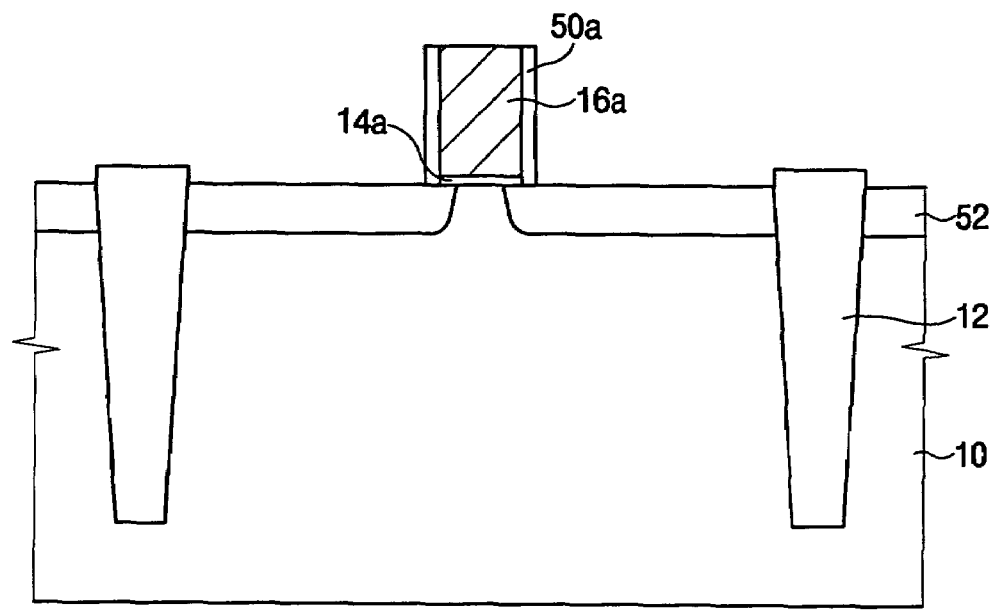

Referring to FIG. 3B, the offset layer 50 is anisotropically etched to thereby form an offset spacer 50a. The offset spacer 50a minimizes the possibility of electrical shorting of the source/drain regions due to the thin processing margin of an overlap distance between the source/drain regions and the gate region in a semiconductor device having a short channel. The offset spacer 50a reduces the overlap distance, thereby improving an overlap capacitance.

Then, impurities are implanted into surface portions of the substrate 10 on which the dummy gate pattern 16a and the offset spacer 50a are already formed to thereby form lightly doped source/drain regions 52.

Figure 3C:
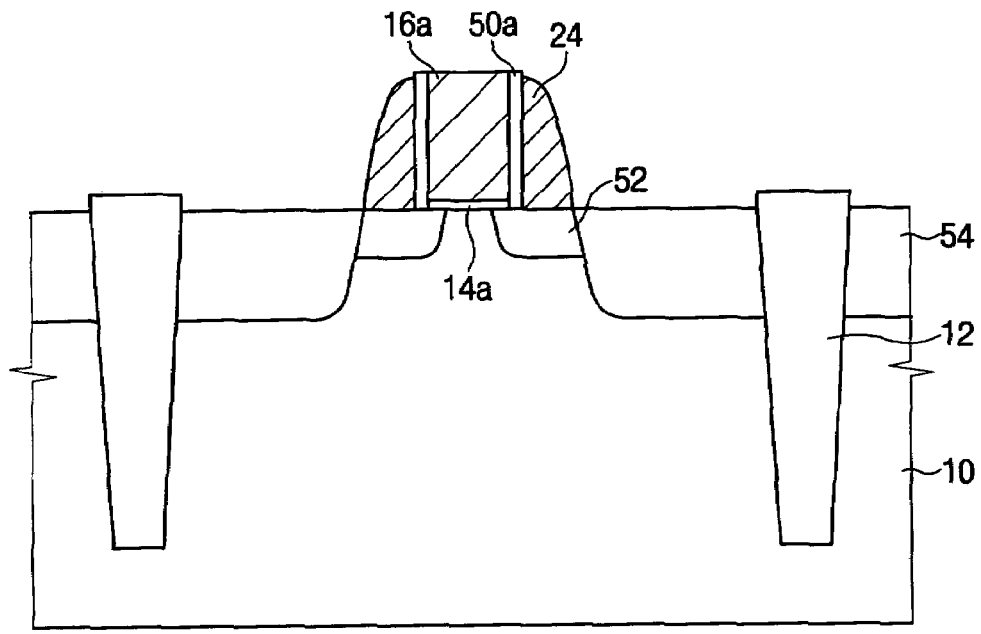

Referring to FIG. 3C, a first spacer 24 is formed on a sidewall of the offset spacer 50a, and impurities are implanted into surface portions of the substrate 10 at both side portions of the offset spacer 50a to thereby form heavily doped source/drain regions 54.

Figure 3D:
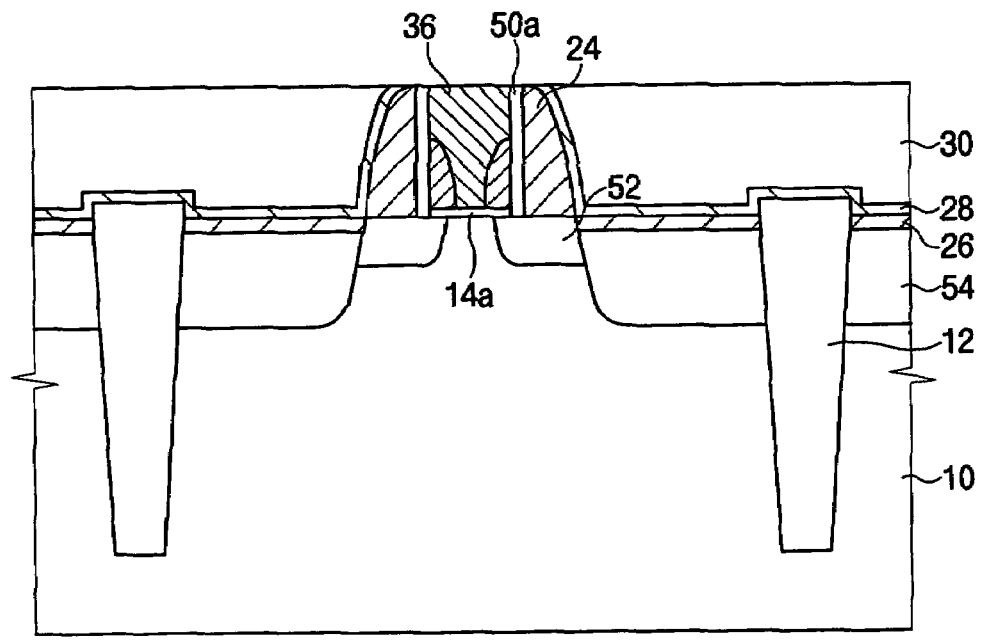

Referring to FIG. 3D, a metal gate pattern 36 is formed through the same processes as described with reference to FIGS. 1E to 1I.

According to the present invention, a gate pattern may be formed to have a line width no more than about the resolution limit of an exposing system by using a spacer formed on a lower portion of the inner sidewall of the trench, so that the channel length of the transistor may be effectively reduced. In addition, the metal gate pattern is also formed to be generally of a T-shape of which a width of an upper portion thereof is larger than a width of a lower portion thereof, so that the gate size is increased to thereby minimize the electrical resistance of the gate pattern.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of forming a metal gate in a semiconductor device, comprising:
   forming a gate insulation pattern and a dummy gate pattern on a substrate;
   forming an insulation interlayer on the dummy gate pattern such that the dummy gate pattern is covered with the insulation interlayer;
   polishing the insulation interlayer to expose a top surface of the dummy gate pattern;
   selectively removing the dummy gate pattern to form a trench on the substrate, the trench exposing the gate insulation pattern;
   forming a gate spacer on an inner sidewall of the trench and on a portion of the gate insulation pattern to reduce a width of the exposed gate insulation pattern;
   filling the trench with a metal to form a metal layer on the exposed gate insulation pattern; and
   polishing the metal layer such that the metal remains in the trench.

2. The method of claim 1, wherein the dummy gate pattern has an etching selectivity with respect to the insulation interlayer.

3. The method of claim 2, wherein the dummy gate pattern comprises silicon oxynitride.

4. The method of claim 1, further comprising implanting ions at surface portions of the substrate, thereby forming source and drain regions neighboring the dummy gate pattern after forming the dummy gate pattern.

5. The method of claim 1, further comprising forming a dummy gate spacer along a sidewall of the dummy gate pattern after forming the dummy gate pattern, the dummy gate spacer comprising a material having an etching selectivity with respect to the dummy gate pattern.

6. The method of claim 5, further comprising forming an offset spacer along a sidewall of the dummy gate pattern for controlling a length of electron diffusion during an ion implantation process before the dummy gate spacer is formed.

7. The method of claim 5, further comprising heavily implanting ions at surface portions of the substrate, thereby forming highly doped source and drain regions neighboring the dummy gate pattern after the dummy gate spacer is formed.

8. The method of claim 1, further comprising selectively forming a metal silicide layer on a portion of the substrate exposed about sidewalls of the dummy gate pattern after the dummy gate pattern is formed.

9. The method of claim 8, wherein the metal silicide layer comprises cobalt silicide, nickel silicide or tungsten silicide.

10. The method of claim 1, further comprising forming an etching stop layer on the dummy gate pattern and the substrate before forming the insulation interlayer.

11. The method of claim 1, wherein, prior to polishing the insulating interlayer, a lower portion of the insulation interlayer is higher than a top surface of the dummy gate pattern.

12. The method of claim 1, wherein the dummy gate pattern is selectively removed by a wet etching process.

13. The method of claim 1, further comprising forming a liner on the inner sidewall of the trench before the gate spacer is formed, that protects the inner sidewall of the trench.

14. The method of claim 13, wherein the liner comprises an oxide layer or a nitride layer.

15. The method of claim 1, wherein the gate spacer comprises a material having an etching selectivity with respect to a gate insulation layer underlying the gate spacer.

16. The method of claim 15, wherein the gate spacer comprises silicon nitride.

17. The method of claim 1, wherein forming the gate spacer includes:
   forming an insulation layer for the gate spacer in the trench and on the insulation interlayer; and
   anisotropically and selectively etching the insulation layer, so that portions of the insulation layer formed on the insulation interlayer and on the gate insulation pattern are selectively removed.

18. The method of claim 1, wherein the gate spacer is selectively formed at a lower portion of the inner sidewall of the trench, so that an upper portion of the inner sidewall of the trench is exposed.

19. The method of claim 1, wherein the metal with which the trench is filled includes molybdenum (Mo) or tungsten (W).

20. The method of claim 1, wherein an upper portion of the metal layer is of a larger width than that of a lower portion of the metal layer.

21. The method of claim 1 wherein a width of the gate spacer controls a width of the metal gate.

22. A method of forming a metal gate in a semiconductor device, comprising:
   forming a gate insulation pattern and a dummy gate pattern on a substrate;
   forming an insulation interlayer to cover the dummy gate pattern;
   polishing the insulation interlayer to expose a top surface of the dummy gate pattern;
   selectively removing the dummy gate pattern to form a trench in the insulation interlayer and on the substrate, the trench exposing the gate insulation pattern;
   forming a gate spacer on an inner sidewall of the trench and on a portion of the gate insulation pattern to reduce a width of the exposed gate insulation pattern, a top of the gate spacer below a top surface of the insulation interlayer;
   selectively removing the gate insulation pattern remaining on a bottom surface of the trench;
   forming a gate insulation layer on the bottom surface of the trench;
   filling the trench with a metal to form a metal layer on the gate insulation layer; and polishing the metal layer such that the metal remains in the trench.

23. The method of claim 22, wherein the gate spacer is selectively formed at a lower portion of the inner sidewall of the trench, so that an upper portion of the inner sidewall of the trench is exposed.

24. The method of claim 22, wherein an upper portion of the metal layer is of a larger width than that of a lower portion of the metal layer.

25. The method of claim 22 wherein a width of the gate spacer controls a width of the metal gate.

* * * * *